(12) United States Patent
Chan et al.

(10) Patent No.: US 8,791,537 B2
(45) Date of Patent: Jul. 29, 2014

(54) FLEXIBLE RADIATION DETECTORS

(75) Inventors: Issac Wing-Tak Chan, Hsinchu (TW);
Chao-Chiun Liang, Hsinchu (TW);
Heng-Yin Chen, Hsinchu County (TW);
Ming-Hua Yeh, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 224 days.

(21) Appl. No.: 13/457,442

(22) Filed: Apr. 26, 2012

(65) Prior Publication Data
US 2013/0161772 A1  Jun. 27, 2013

(30) Foreign Application Priority Data
Dec. 27, 2011  (TW) .............................. 100148808 A

(51) Int. Cl.
*H01L 31/0232* (2014.01)
*H01L 31/045* (2006.01)
*H01L 31/0216* (2014.01)
*H01L 31/055* (2014.01)
*H01L 31/115* (2006.01)

(52) U.S. Cl.
CPC ........ *H01L 31/02322* (2013.01); *H01L 31/045* (2013.01); *H01L 31/02162* (2013.01); *H01L 31/0232* (2013.01); *H01L 31/055* (2013.01); *H01L 31/115* (2013.01)
USPC .................. 257/436; 257/428; 257/E31.092; 257/E31.121

(58) Field of Classification Search
CPC ..................... H01L 31/02162; H01L 31/0232; H01L 31/02322; H01L 31/045; H01L 31/055; H01L 31/115
USPC .................. 257/428, 436, E31.092, E31.121
See application file for complete search history.

(56) References Cited

U.S. PATENT DOCUMENTS

| | | | |
|---|---|---|---|
| 5,864,146 A | 1/1999 | Karellas | |
| 6,713,062 B1 | 3/2004 | Merchant | |
| 6,717,174 B2 | 4/2004 | Karellas | |
| 6,856,670 B2 | 2/2005 | Hoheisel | |
| 7,288,679 B2 | 10/2007 | Vanmaele et al. | |
| 7,446,318 B2 | 11/2008 | Campbell | |
| 7,498,342 B2 | 3/2009 | Ibrahim et al. | |
| 7,567,649 B1 | 7/2009 | Safai et al. | |

(Continued)

FOREIGN PATENT DOCUMENTS

| | | |
|---|---|---|
| TW | 201002348 | 1/2010 |
| WO | WO 2010047494 | 4/2010 |

OTHER PUBLICATIONS

Guoying Qu et al., "A Novel Dual Screen-Dual Film Combination for Mammography," SPIE Conference on Physics of Medical Imaging, Feb. 22, 1998, pp. 572-582,vol. 3336, SPIE, US.
Afrin Sultana et al., "Digital X-Ray Imaging Using Avalanche a-Se Photoconductor," IEEE Sensors Journal, Feb. 2010, pp. 347-352, vol. 10, No. 2, IEEE, US.

(Continued)

*Primary Examiner* — Tom Thomas
*Assistant Examiner* — Christopher M Roland

(57) ABSTRACT

Disclosed is a flexible radiation detector including a substrate, a switching device on the substrate, an energy conversion layer on the switching device, a top electrode layer on the energy conversion layer, a first phosphor layer on the top electrode layer, and a second phosphor layer under the substrate.

18 Claims, 5 Drawing Sheets

(56) References Cited

U.S. PATENT DOCUMENTS

| | | |
|---|---|---|
| 7,569,832 B2 | 8/2009 | Tredwell et al. |
| 7,629,633 B2 | 12/2009 | Chan et al. |
| 7,825,382 B2 | 11/2010 | Campbell |
| 7,834,321 B2 | 11/2010 | Yorkston et al. |
| 7,947,708 B2 | 5/2011 | Ibrahim et al. |
| 2003/0148295 A1 | 8/2003 | Wan et al. |
| 2003/0173532 A1* | 9/2003 | Takahashi et al. ............ 250/584 |
| 2005/0267345 A1 | 12/2005 | Korgel et al. |
| 2006/0054835 A1 | 3/2006 | Rowlands et al. |
| 2006/0151708 A1* | 7/2006 | Bani-Hashemi et al. 250/370.11 |
| 2007/0075253 A1 | 4/2007 | Misawa et al. |
| 2007/0262266 A1 | 11/2007 | Hoheisel et al. |
| 2008/0274155 A1 | 11/2008 | Barton et al. |
| 2009/0036321 A1 | 2/2009 | Moler et al. |
| 2010/0127279 A1* | 5/2010 | Takahashi ...................... 257/80 |
| 2010/0331200 A1 | 12/2010 | Gordon et al. |
| 2011/0024642 A1* | 2/2011 | Tredwell et al. ......... 250/370.09 |

OTHER PUBLICATIONS

Afrin Sultana et al., "Design and Feasibility of Active Matrix Flat Panel Detector Using Avalanche Amorphous Selenium for Protein Crystallography," Med. Phys., Oct. 2008, vol. 35, pp. 4324-4332, Am. Assoc. Phys. Med., US.

A. Reznik et al., "Applications of Avalanche Multiplication in Amorphous Selenium to Flat Panel Detectors for Medical Applications," J Mater Sci: Mater Electron, 2009, pp. S63-S67, Springer, US.

M. M. Wronski et al., "A Solid-State Amorphous Selenium Avalanche Technology for Low Photon Flux Imaging Applications," Med. Phys., Sep. 2010, pp. 4982-4985, vol. 37, Am. Assoc. Phys. Med., US.

W. Que et al., "X-ray Imaging Using Amorphous Selenium: Inherent Spatial Resolution," Med. Phys. ,Apr. 1995, pp. 365-374, vol. 22, Am. Assoc. Phys. Med., US.

A. Gektin et al., " Inorganic-Organic Rubbery Scintillators," Nuclear Instruments & Methods in Physics Research, A486, 2002, pp. 191-195, Elsevier, US.

* cited by examiner

FLEXIBLE RADIATION DETECTORS

CROSS REFERENCE TO RELATED APPLICATIONS

This Application claims priority of Taiwan Patent Application No. 100148808, filed on Dec. 27, 2011, the entirety of which is incorporated by reference herein.

BACKGROUND

1. Technical Field

The disclosure relates to a flexible radiation detector, and in particular relates to a structure of a phosphor layer thereof.

2. Description of the Related Art

In general, digital X-ray image detectors are classified into a direct conversion type and an indirect conversion type. In the detectors of the indirect conversion type, an X-ray is transferred to a visible light, and the visible light is transferred to a current by a photoelectrical conversion device (e.g. diode). The current is then processed by a switching device (e.g. TFT) to obtain an X-ray image. The detectors of the indirect conversion type can be flexible; however, a phosphor dispersed in a resin thereof easily results in scattering to reduce X-ray image resolution. In the detectors of the direct conversion type, an X-ray can be directly transferred to electrons and holes by a photoelectric conversion device composed of a thick amorphous selenium layer (>500 μm). As such, the hole current may vertically flow to a pixel electrode and a switching device to obtain an X-ray image of high resolution. Accordingly, the conventional X-ray image detectors of high resolution have low flexibility due to the overly thick photoelectric conversion device, and the flexible X-ray image detectors have a low resolution. A novel X-ray image detector simultaneously having high resolution, high sensitivity, and flexibility is called for.

SUMMARY

One embodiment of the disclosure provides a flexible radiation detector, comprising: a substrate; a switching device on the substrate; an energy conversion layer on the switching device; a top electrode layer on the energy conversion layer; a first phosphor layer on the top electrode layer; and a second phosphor layer under the substrate.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
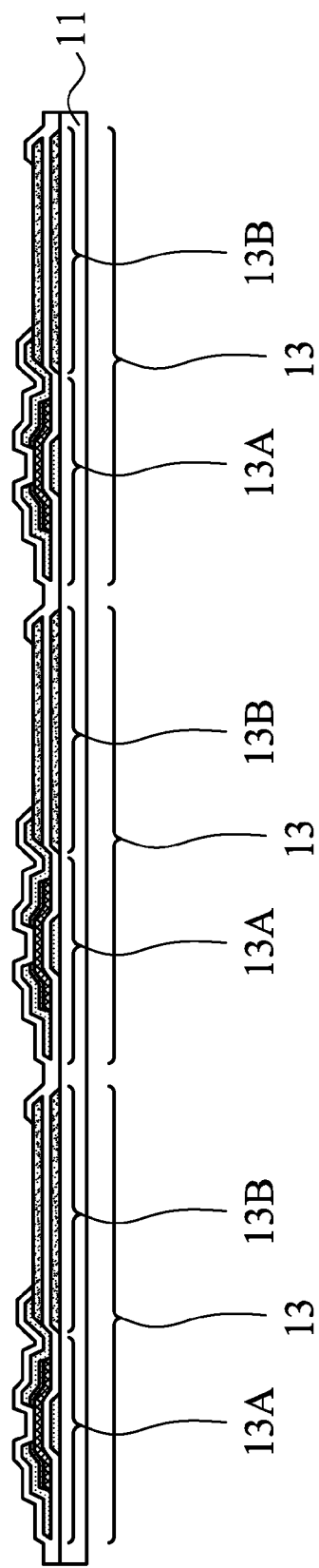
FIGS. 1-3 show processes of manufacturing a flexible radiation detector in one embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
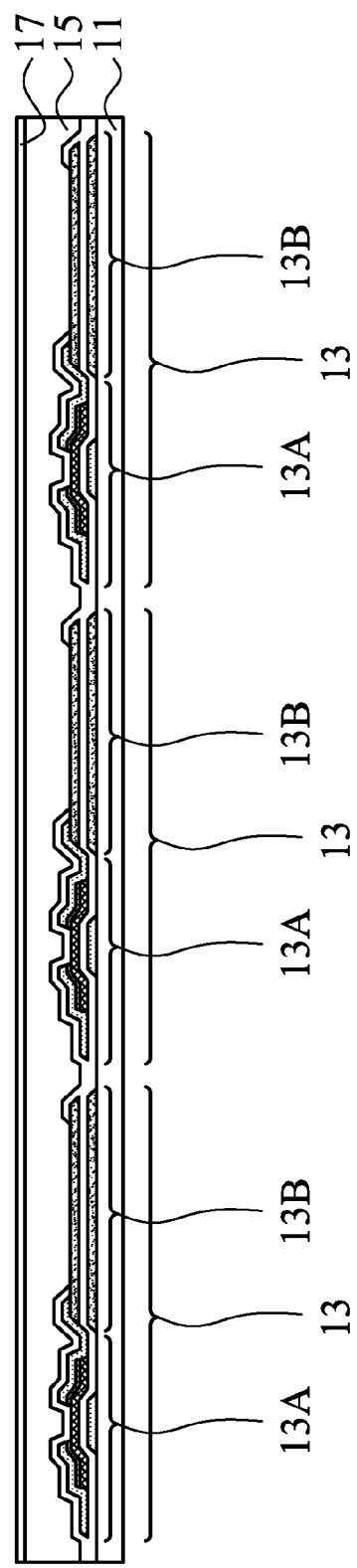
Figure 3:
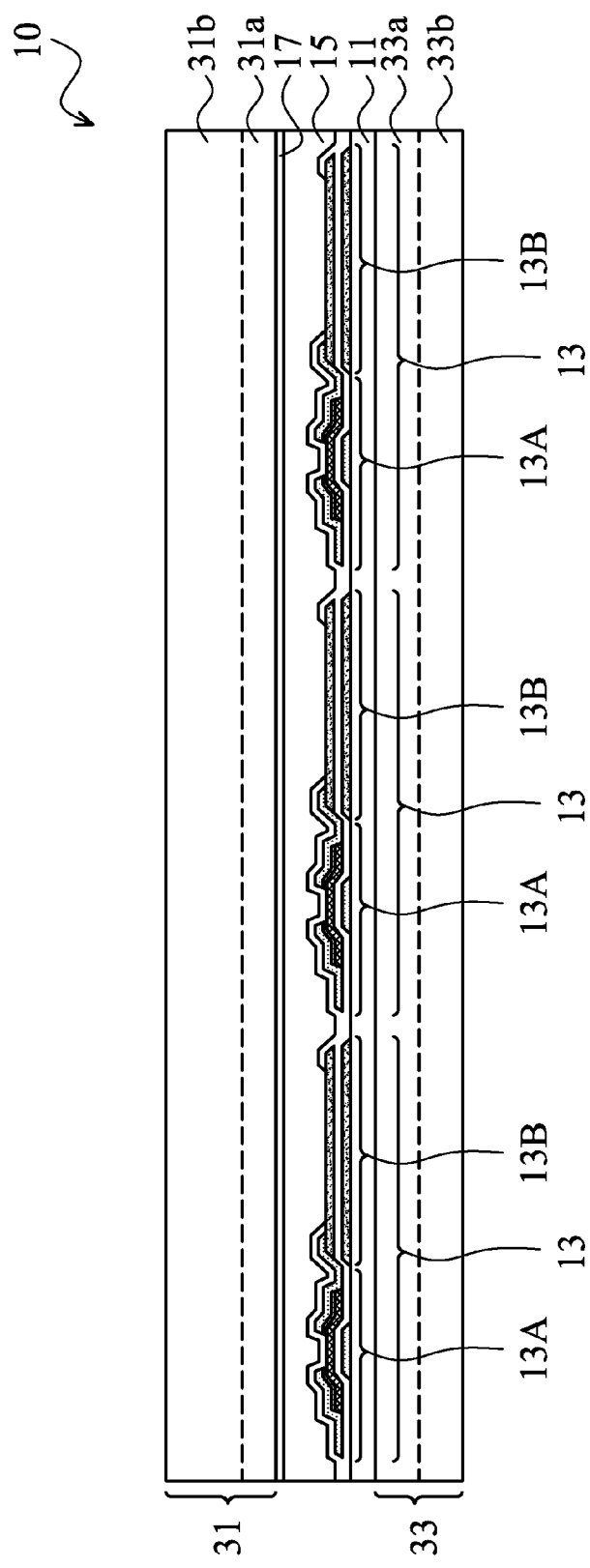

FIGS. 1-3 show processes of manufacturing a flexible radiation detector 10 in one embodiment of the disclosure. Firstly, an array of switching devices 13 is formed on a substrate 11. The substrate 11 can be plastic such as PI, PEN, or PES. The substrate 11 may have a thickness of about 10 μm to 20 μm. Each of the switching devices 13 includes a thin film transistor (TFT) 13A, a storage capacitor 13B, and a pixel electrode (not shown). In one embodiment, the TFT 13A electrically connects to the large area pixel electrode (not shown). A electron current or a hole current produced by an energy conversion layer will be conducted to the TFT 13A by the pixel electrode. The processes of forming the TFT, the storage capacitor, and the pixel electrode are well-known in the field of manufacturing array substrates of LCDs and therefore omitted here. In one embodiment, the switching devices 13 further include an active pixel sensor (APS). In one embodiment, the TFT of the switching device 13 is a TFT including a top gate structure, a bottom gate structure, a dual gate structure, or a multi gate structure. For processes of forming TFT array, reference may be made to *Thin Film Transistors: Materials and Processes, Vol. 1—Amorphous Silicon Thin Film Transistors*, edited by Yue Kuo, Kluwer Academic Publishers, USA, 2004, Ch. 4 and therefore omitted here.

As shown in FIG. 2, an energy conversion layer 15 is then blanketly formed on the switching devices 13, and a top electrode layer 17 is then formed on the energy conversion layer 15. The energy conversion layer 15 can be a semiconductor material such as amorphous selenium, $HgI_2$, or $PbI_2$. For example, the amorphous selenium layer may have a thickness of about 1 μm to 25 μm, the $HgI_2$ layer may have a thickness of 0.3 μm to 7.5 μm, and the $PbI_2$ layer may have a thickness of 0.3 μm to 7.5 μm. An overly thin energy conversion layer 15 cannot transfer an ultraviolet light and/or a visible light to electrons and holes. An overly thick energy conversion layer 15 may affect a flexibility of the flexible radiation detector 10. In one embodiment, the energy conversion layer 15 can be a single-layered structure of semiconductor material. In another embodiment, the energy conversion layer 15 can be a multi-layered structure of semiconductor materials, such as a P-I-N structure, an I-P structure, or an I-N structure. For example, when the amorphous selenium is adopted to compose the energy conversion layer 15, which can be an amorphous selenium doped by a p-type dopant/amorphous selenium without a doping/amorphous selenium doped by an n-type dopant (P-I-N) structure, an amorphous selenium without a doping/amorphous selenium doped by an n-type dopant (I-N) structure, or an amorphous selenium doped by a p-type dopant/amorphous selenium without a doping (I-P) structure. In other embodiments, a dielectric layer (not shown) or other layered structures can be disposed between the energy conversion layer 15 and the top electrode layer 17, and/or between the energy conversion layer 15 and the switching devices 13. Note that the electron current or the current produced by the energy conversion layer 15 will be conducted to the top electrode layer 17 and the switching devices 13, respectively, without being influenced by the dielectric layer or other layered structures.

In FIG. 2, the top electrode layer 17 (on the energy conversion layer 15) is electrically connected to an external voltage (not shown), such as a positive voltage of about 1V to 250V or a negative electrode of about −1V to −250V. When the energy conversion layer 15 is composed of amorphous selenium, the external voltage can be about 10V to 250V. When the energy conversion layer 15 is composed of HgI$_2$, the external voltage can be about 1V to 25V. When the energy conversion layer 15 is composed of PbI$_2$, the external voltage can be about 1V to 25V. The composition and the formation of the top electrode layer 17 can be a general conductive material such as Mo, W, Ti, or Al, stack structures thereof, or alloys thereof. The top electrode layer 17 can be a general transparent conductive material such as ITO or IZO. For example, the Mo film can be deposited by sputtering, the W film can be deposited by sputtering, the Ti film can be deposited by sputtering, the Al film can be deposited by sputtering or evaporation, the ITO film can be deposited by sputtering, and the IZO film can be deposited by sputtering.

As shown in FIG. 3, a first phosphor layer 31 is then formed on the top electrode layer 17, and a second phosphor layer 33 is then formed under the substrate 11, respectively. The first phosphor layer 31 and the second phosphor layer 33 include a phosphor powder dispersed in a resin, respectively. The suitable phosphor powder includes Gd$_2$O$_2$S:Tb, Gd$_2$O$_2$S:Pr, Gd$_2$O$_2$S:Pr,Ce,F, Y$_2$O$_2$S:Tb, Y$_2$O$_2$S:Pr, Zn$_{(0.5)}$Cd$_{(0.4)}$S:Ag (HS), CdWO$_4$, CaWO$_4$, ZnS:Cu (GS), NaI:Tl, or CsI:Tl.

The phosphor powder may absorb an X-ray and then emit a visible light and/or an ultraviolet light. In other words, the X-ray is transferred to the visible light and/or the ultraviolet light by the phosphor powder. In one embodiment, the first and second phosphor layers 31 and 33 have a thickness of about 50 µm to 100 µm, respectively. An overly thick first and/or second phosphor layer (31 and/or 33) may deteriorate the scattering problem of the visible light and/or the ultraviolet light emitted from the phosphor powder, thereby reducing the X-ray image resolution. An overly thin first and/or second phosphor layer (31 and/or 33) cannot efficiently transfer the incident X-ray to the visible light and/or the ultraviolet light. In one embodiment, the phosphor powder has a diameter of about 0.1 µm to 20 µm. A larger phosphor powder may transfer the X-ray to the visible light and/or the ultraviolet light with a higher efficiency, but also deteriorate the scattering problem of the visible light and/or the ultraviolet light emitted from the phosphor powder. A smaller phosphor powder may reduce or prevent the scattering problem of the visible light and/or the ultraviolet light, but cannot efficiently transfer the X-ray to the visible light and/or the ultraviolet light.

In one embodiment, the first and second phosphor layers 31 and 33 are double layered, respectively, as shown in FIG. 3. Although both of the first and second phosphor layers are double layered in FIG. 3, a single layered first phosphor layer 31 may collocate with a double layered second phosphor layer 33, and a double layered first phosphor layer 31 may collocate with a single layered second phosphor layer 33 if necessary. In one embodiment, the first phosphor layer 31 is separated to a first layer 31a and a second layer 31b. The first layer 31a includes a first phosphor powder dispersed in a first resin, and the second layer 31b includes a second phosphor powder dispersed in a second resin, respectively. The first phosphor powder of the first layer 31a has a diameter greater than that of the second phosphor powder of the second layer 31b, or the second layer 31b has a thickness greater than that of the first layer 31a. Similarly, the second phosphor layer 33 is separated to a third layer 33a and a fourth layer 33b. The third layer 33a includes a third phosphor powder dispersed in a third resin, and the fourth layer 33b includes a fourth phosphor powder dispersed in a fourth resin, respectively. The third phosphor powder of the third layer 33a has a diameter greater than that of the fourth phosphor powder of the fourth layer 33b, or the fourth layer 33b has a thickness greater than that of the third layer 33a. In one embodiment, the first phosphor powder (or the third phosphor powder) of the first layer 31a (or the third layer 33a) has a diameter of about 10 µm to 20 µm, and the second phosphor powder (or the fourth phosphor powder) of the second layer 31b (or the fourth layer 33b) has a diameter of about 0.1 µm to 10 µm. In another embodiment, the first layer 31a (or the third layer 33a) has a thickness of about 20 µm to 40 µm, and the second layer 31b (or the fourth layer 33b) has a thickness of about 30 µm to 60 µm. Therefore, the first layer 31a (or the third layer 33a) near the energy conversion layer 15 has a high X-ray conversion efficiency, and the visible light and/or the ultraviolet light emitted from the phosphor powder may enter the energy conversion layer 15 without scattering in the first phosphor layer 31 (or the second phosphor layer 33). The second layer 31b (or the fourth layer 33b) has a lower X-ray conversion efficiency, such that the scattering problem of the visible light and/or the ultraviolet light emitted from the phosphor powder is less. The double layered first and second phosphor layers 31 and 33 may simultaneously enhance the X-ray conversion efficiency and reduce (or avoid) the scattering problem of the visible light and/or the ultraviolet light emitted from the phosphor powder. In the first phosphor layer 31 (or the second phosphor layer 33), the first layer 31a (or the third layer 33a) and the second layer 31b (or the fourth layer 33b) may include same or different phosphor powders. It should be understood that the first and second phosphor layers 31 and 33 are not only the double layered structure as shown in FIG. 3, but also other multi layered structures such as triple layered, quadruple layered, or more layered. Whatever the sub-layer number of the phosphor layer is, the sub-layer near the energy conversion layer 15 has a thickness less than that of a sub-layer distant from the energy conversion layer 15, or the sub-layer near the energy conversion layer 15 has a phosphor powder larger than that of a sub-layer distant from the energy conversion layer 15. For example, the first phosphor layer 31 further includes a fifth layer (not shown) disposed between the first layer 31a and the second layer 31b, and/or the second phosphor layer 33 further includes a sixth layer (not shown) disposed between the third layer 33a and the fourth layer 33b. In one embodiment, the fifth layer (or the sixth layer) is thicker than the first layer 31a (or the third layer 33a) and thinner than the second layer 31b (or the fourth layer 33b). In another embodiment, the fifth layer (or the sixth layer) includes a fifth phosphor powder (or a sixth phosphor powder) dispersed in a fifth resin (or a sixth resin). The fifth phosphor powder (or the sixth phosphor powder) has a diameter less than that of the first phosphor powder (or the third phosphor powder) and greater than that of the second phosphor powder (or the fourth phosphor powder). In one embodiment, the fifth phosphor powder (or the sixth phosphor powder) of the fifth layer (or the sixth layer) has a diameter of about 5 µm to 15 µm. In another embodiment, the fifth layer (or the sixth layer) has a thickness of about 25 µm to 50 µm.

Figure 4:
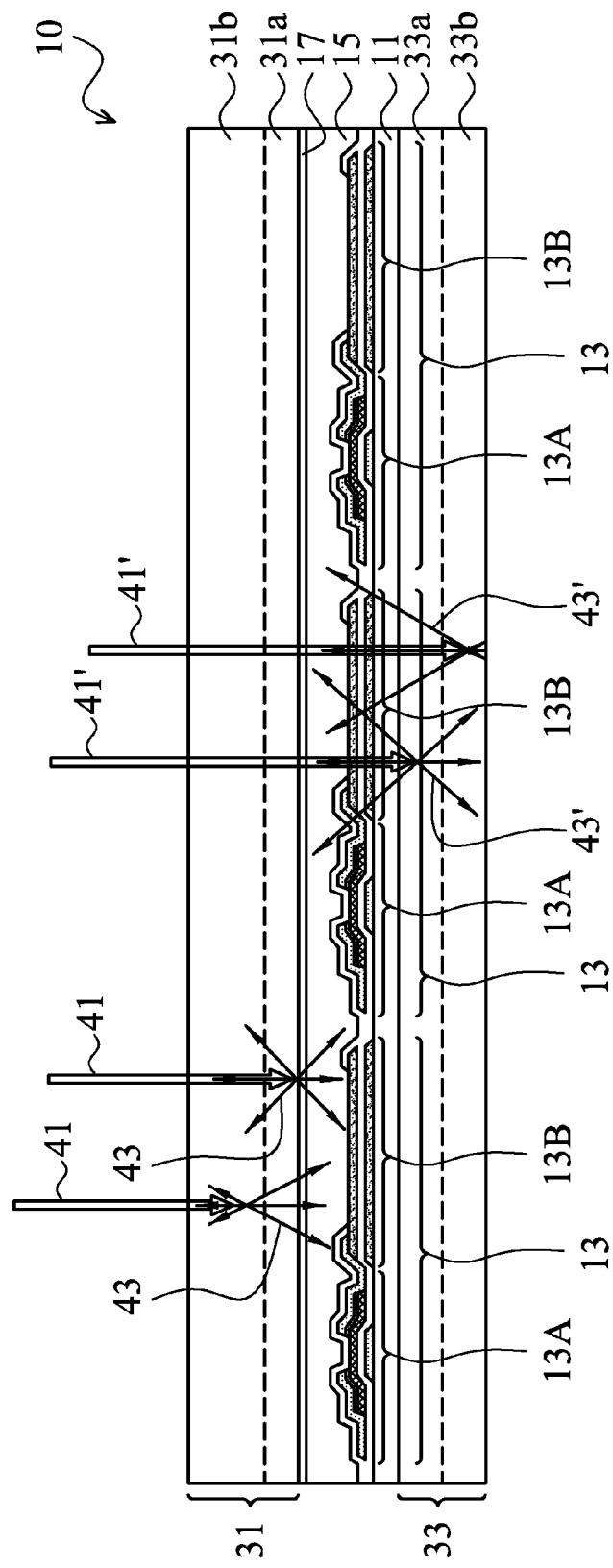
FIG. 4 shows an X-ray entering a flexible radiation detector in one embodiment of the disclosure.

As shown in FIG. 4, when the flexible radiation detector 10 is exposed by an X-ray, a part of the X-ray 41 will be transferred to a visible light and/or an ultraviolet light 43 by a phosphor powder of the first phosphor layer 31, and the other part of the X-ray 41' will travel through the first phosphor layer 31, the energy conversion layer 15, the switching devices 13, and the substrate 11 to enter the second phosphor layer 33. Subsequently, the other part of the X-ray 41' is transferred to a visible light and/or an ultraviolet light 43' by a phosphor powder of the second phosphor layer 33. In one embodiment, the part of the X-ray 41 is transferred to an ultraviolet light by the first phosphor layer 31, and the other part of the X-ray 41' is transferred to a blue light by the second phosphor layer 33. It should be understood that the visible light and/or the ultraviolet light (43 and 43') depends on the phosphor powder type of the first and second phosphor layers 31 and 33. The visible light and/or the ultraviolet light 43 and 43' entering the energy conversion layer 15 will be transferred to electrons and holes. If the top electrode layer 17 is electrically connected to a positive external voltage (not shown), the electrons will migrate to the top electrode layer 17, and the holes will migrate to the pixel electrode of the switching devices 13. As such, the holes are accumulated to form a hole current, and the hole current is conducted to the TFT 13A of the switching devices 13 to form electronic signals. In another embodiment, the top electrode layer 17 is electrically connected to a negative external voltage (not shown), such that the holes migrate to the top electrode layer 17, and the electrons migrate to the pixel electrode of the switching devices 13. As such, the electrons are accumulated to form an electron current, and the electron current is conducted to the TFT 13A of the switching devices 13 to form electronic signals. The electronic signals from the array of the switching device 13 will be combined to obtain a digital image of the X-ray 41 and 41'. In practice, the first phosphor layer 31 of the flexible radiation detector 10 is conformally disposed on a surface of a non-planar object (e.g. human body). Thereafter, an X-ray is applied to travel through the object. The X-ray is transferred to a visible light and/or an ultraviolet light by the first and second phosphor layers 31 and 33, and the visible light and/or the ultraviolet light is transferred to holes and electrons by the energy conversion layer 15. The holes (or the electrons) then flow to the switching devices 13 to form electronic signals.

Figure 5:
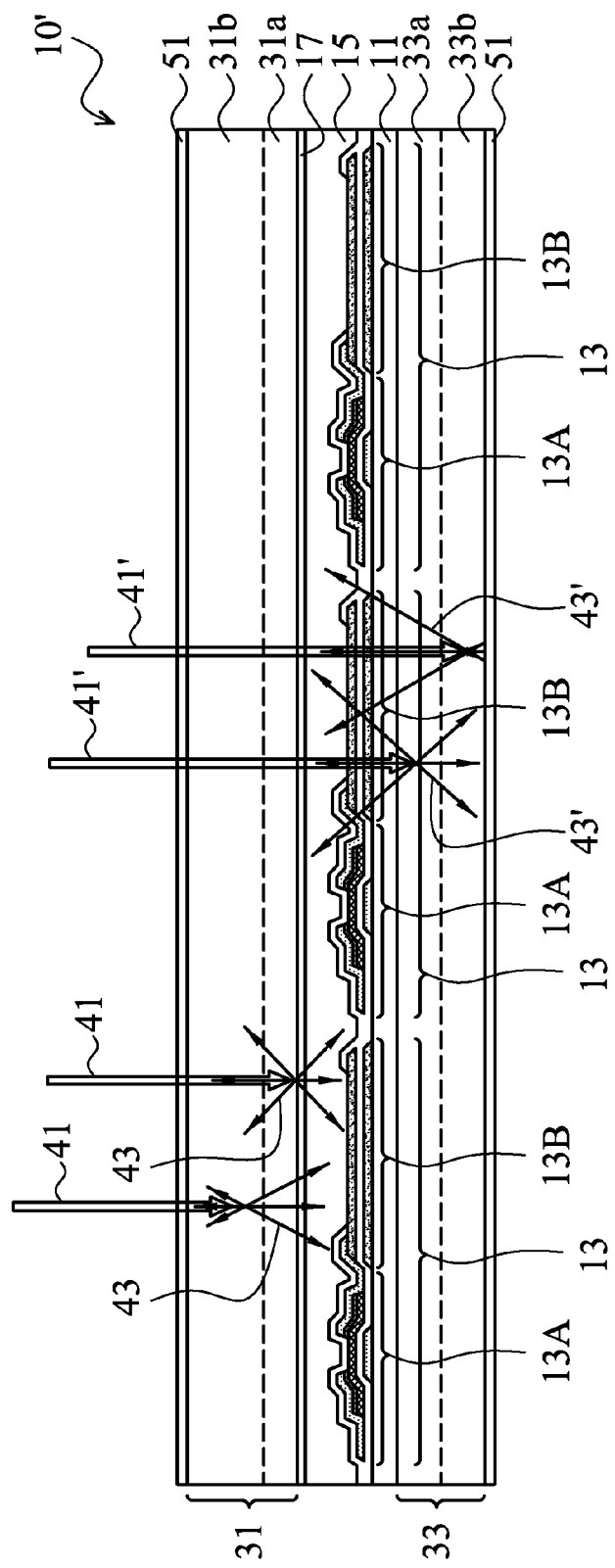
FIG. 5 shows a flexible radiation detector in one embodiment of the disclosure.

As shown in FIG. 4, a part of the visible light and/or the ultraviolet light 43 and 43' will enter the energy conversion layer 15, and the other part of the visible light and/or the ultraviolet light 43 and 43' will be emitted toward the outside the flexible radiation detector 10. A layered material 51 can be disposed on the first phosphor layer 31 and/or under the second phosphor layer 33 for utilizing or eliminating the visible light and/or the ultraviolet light 43 and 43' emitted toward the outside the flexible radiation detector, as shown in a flexible radiation detector 10' of FIG. 5. If the layered material 51 is a reflective material for the visible light and/or the ultraviolet light, e.g. Al, Mo, or W, the visible light and/or the ultraviolet light 43 and 43' emitted toward the outside the flexible radiation detector will be reflected back to the energy conversion layer 15, thereby enhancing the X-ray image intensity. If the layered material 51 is an absorbent material for the visible light and/or the ultraviolet light, e.g. black pigment, the visible light and/or the ultraviolet light 43 and 43' emitted toward the outside the flexible radiation detector will be absorbed by the layered material 51 rather than scattering in the first and second phosphor layers 31 and 33, thereby enhancing the X-ray image resolution.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A flexible radiation detector, comprising:
    a substrate;
    a switching device on the substrate;
    an energy conversion layer on the switching device;
    a top electrode layer on the energy conversion layer;
    a first phosphor layer on the top electrode layer; and
    a second phosphor layer under the substrate,
    wherein the first phosphor layer comprises:
        a first layer; and
        a second layer,
    wherein the first layer is disposed between the second layer and the top electrode layer, and the second layer is thicker than the first layer,
    wherein the first layer comprises a first phosphor powder consisting of phosphor particles having a first average particle diameter dispersed in a first resin, the second layer comprises a second phosphor powder consisting of phosphor particles having a second average particle diameter dispersed in a second resin, and the first average particle diameter is greater than the second average particle diameter, such that an X-ray conversion efficiency of the first layer is greater than that of the second layer,
    wherein the first average particle diameter is about 10 μm to 20 μm, and the second average particle diameter is about 0.1 μm to 10 μm.

2. The flexible radiation detector as claimed in claim 1, wherein the second phosphor layer comprises a phosphor powder dispersed in a resin.

3. The flexible radiation detector as claimed in claim 2, wherein the first phosphor powder, the second phosphor powder, and the phosphor powder of the second phosphor layer absorb an X-ray and emit a visible light and/or an ultraviolet light.

4. The flexible radiation detector as claimed in claim 1, wherein particles of the first phosphor powder near the top electrode layer have a diameter larger than that of particles of the first phosphor powder distant from the top electrode layer, and particles of the second phosphor powder near the top electrode layer have a diameter larger than that of particles of the second phosphor powder distant from the top electrode layer.

5. The flexible radiation detector as claimed in claim 1, wherein the first phosphor layer further comprises a fifth layer disposed between the first layer and the second layer, the fifth layer is thicker than the first layer, and the fifth layer is thinner than the second layer.

6. The flexible radiation detector as claimed in claim 5, wherein the fifth layer comprises a fifth phosphor powder consisting of phosphor particles having a fifth average particle diameter dispersed in a fifth resin, the fifth average particle diameter being less than the first average particle diameter, and greater than the second average particle diameter.

7. The flexible radiation detector as claimed in claim 6, wherein the fifth average particle diameter is about 5 μm to 15 μm.

8. The flexible radiation detector as claimed in claim 1, wherein the second phosphor layer comprises:
    a third layer; and
    a fourth layer,
    wherein the third layer is disposed between the fourth layer and the substrate, and the fourth layer is thicker than the third layer.

9. The flexible radiation detector as claimed in claim 8, wherein the third layer comprises a third phosphor powder consisting of phosphor particles having a third average particle diameter dispersed in a third resin, the fourth layer comprises a fourth phosphor powder consisting of phosphor particles having a fourth average particle diameter dispersed in a fourth resin, and the third average particle diameter is greater than the fourth average particle diameter.

10. The flexible radiation detector as claimed in claim 9, wherein the third average particle diameter is about 10 μm to 20 μm and the fourth average particle diameter is about 0.1 μm to 10 μm.

11. The flexible radiation detector as claimed in claim 9, wherein the second phosphor layer further comprises a sixth layer disposed between the third layer and the fourth layer, the sixth layer is thicker than the third layer, and the sixth layer is thinner than the fourth layer.

12. The flexible radiation detector as claimed in claim 11, wherein the sixth layer comprises a sixth phosphor powder consisting of phosphor particles having a sixth average particle diameter dispersed in a sixth resin, the sixth average particle diameter is less than the third average particle diameter, and greater than the fourth average particle diameter.

13. The flexible radiation detector as claimed in claim 12, wherein the sixth average particle diameter is about 5 μm to 15 μm.

14. The flexible radiation detector as claimed in claim 1, wherein the energy conversion layer has a thickness of about 1 μm to 25 μm.

15. The flexible radiation detector as claimed in claim 1, wherein the energy conversion layer is a single-layered structure of semiconductor material, or a multi-layered structure of semiconductor materials, wherein the multi-layered structure comprises a P-I-N structure, an I-P structure, or an I-N structure.

16. The flexible radiation detector as claimed in claim 1, wherein the energy conversion layer transfers an ultraviolet or visible light to electrons and holes.

17. The flexible radiation detector as claimed in claim 1, wherein the substrate has a thickness of about 10 μm to 20 μm.

18. The flexible radiation detector as claimed in claim 1, further comprising a reflective layer or an absorbent layer on the first phosphor layer or under the second phosphor layer.

\* \* \* \* \*